(12) United States Patent
Hasegawa et al.

(10) Patent No.: US 7,635,551 B2
(45) Date of Patent: *Dec. 22, 2009

(54) POLY (IMIDE-AZOMETHINE) COPOLYMER, POLY (AMIC ACID-AZOMETHINE) COPOLYMER, AND POSITIVE PHOTOSENSITIVE RESIN COMPOSITION

(75) Inventors: Masatoshi Hasegawa, Chiba (JP); Junichi Ishii, Tochigi (JP)

(73) Assignees: Sony Corporation, Tokyo (JP); Sony Chemical & Information Device Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/660,496

(22) PCT Filed: Jul. 27, 2005

(86) PCT No.: PCT/JP2005/013704

§ 371 (c)(1),
(2), (4) Date: Feb. 20, 2007

(87) PCT Pub. No.: WO2006/025163

PCT Pub. Date: Mar. 9, 2006

(65) Prior Publication Data

US 2007/0254245 A1 Nov. 1, 2007

(30) Foreign Application Priority Data

Aug. 31, 2004 (JP) .............................. 2004-253632

(51) Int. Cl.
G03F 7/004 (2006.01)
G03F 7/30 (2006.01)

(52) U.S. Cl. ...................... 430/192; 430/193; 430/326; 430/330; 528/266

(58) Field of Classification Search ................ 430/192, 430/193, 270.1, 313, 326, 330; 528/266
See application file for complete search history.

(56) References Cited

U.S. PATENT DOCUMENTS 5,066,765 A * 11/1991 Wada et al. ................. 528/185
5,409,793 A * 4/1995 Sacripante et al. ....... 430/109.5
6,001,517 A * 12/1999 Kawamonzen ............... 430/18
2006/0269868 A1 * 11/2006 Hasegawa et al. ........ 430/270.1

FOREIGN PATENT DOCUMENTS

EP 0 681 223 B1 11/1995
JP A 49-37995 4/1974
JP A 64-079233 3/1989
JP A 02-042372 2/1990
JP A 02-156655 6/1990
JP A 03-185066 8/1991
JP A 07-301952 11/1995
JP A 2002-161136 6/2002

OTHER PUBLICATIONS

Idage, S. et al., "Synthesis and Characterization of Polyimides and Polyamide-imides Containing Azomethine Linkages," 1992, Polymer International, vol. 28, No. 2, pp. 105-113.

Suematsu, K. et al., "Synthesis of CH=N Double Bond Containing Polymers (Polyimine) by the Codensation of Diamines and Dialdehydes," 1983, The Society of Synthetic Organic Chemistry, vol. 41, No. 10, pp. 972-985.

Saegusa, Y. et al., "Preparation and Characterization of Fluorine-Containing Aromatic Polyazomethines and Copolyazomethines from Perfluoroisopropylidene Group-Containing Aromatic Diamines and/or Isopropylidene Group-Containing Aromatic Diamines and Phthalaldehydes," 1994, Macromol. Chem. Phys., vol. 195, pp. 1877-1889.

Numata, S. et al., "Re-examination of the Relationship Between Packing Coefficient and Thermal Expansion Coefficient for Aromatic Polyimides," 1987, Polymer, vol. 28, pp. 2282-2288.

Hasegawa, M. et al., "Spontaneous Molecular Orientation of Polyimides Induced by Thermal Imidization. 2. In-Plane Orientation," 1996, Macromolecules, vol. 29, pp. 7897-7909.

Hasegawa, M. et al., "Film Properties of Polazomethines," Preprint of the Annual Conference of the Society of Polymer Science, Japan, 2003, vol. 52, No. 7, p. 1295.

Hasegawa, M., "Semi-Aromatic Polyimides with Low Dielectric Constant and Low CTE," 2001, High Perform. Polym., vol. 13, pp. S93-S106.

Hasegawa, M. et al., "Polyimides Containing Trans-1, 4-Cyclohexane Unit. Polymerizability of their Precursors and Low-CTE, Low-K and High $T_g$ Properties," 2003, High Performance Polymers, vol. 15, pp. 47-64.

* cited by examiner

*Primary Examiner*—John S Chu
(74) *Attorney, Agent, or Firm*—Oliff & Berridge, PLC (57) ABSTRACT

A poly(imide-azomethine)copolymer that has a low linear thermal expansion coefficient and a method for producing the same copolymer are provided. Also provided are a poly(amic acid-azomethine)copolymer that is a precursor polymer of the poly(imide-azomethine)copolymer; a positive photosensitive resin composition composed of the precursor polymer and a photosensitizer; and a method for making a fine pattern of poly(imide-azomethine) copolymer from the resin composition.

4 Claims, 2 Drawing Sheets

POLY (IMIDE-AZOMETHINE) COPOLYMER, POLY (AMIC ACID-AZOMETHINE) COPOLYMER, AND POSITIVE PHOTOSENSITIVE RESIN COMPOSITION

TECHNICAL FIELD

The present invention relates to a useful poly(imide-azomethine)copolymer that has a relatively low thermal expansion coefficient, a relatively high glass transition temperature, and a high toughness, and a method for producing the same copolymer. It also relates to a poly(amic acid-azomethine)copolymer that is a precursor polymer of the poly(imide-azomethine)copolymer; a positive photosensitive resin composition containing the precursor polymer along with a photosensitizer; and a method for forming a fine pattern of poly(imide-azomethine)copolymer from the resin composition.

BACKGROUND ART

Heat resistance high enough to withstand the heat applied during the soldering process is one of the essential requirements for insulating materials used in various electronic devices, such as substrates for flexible printed wiring circuits, substrates for tape automated bonding, protective films for semiconductor devices, and interlayer insulating films for integrated circuits. Polyimides are heat-resistant insulating materials that meet this requirement and are thus widely used in electronic devices.

As insulating materials have become increasingly used in an ever-broader range of applications, other properties than high heat resistance are required of these materials, including low dielectric constant, low thermal expansion, high transparency, high frequency characteristics (low dielectric loss tangent), low moisture absorbance, high dimensional stability, adhesion, workability, and the like. No known polyimides, insulating materials now commonly used in electronic devices, have ever met all of these requirements. Thus, much effort has been devoted to developing non-polyimide heat resistant polymers and composite polyimides in which polyimides combined with other polymers are chemically modified.

The high heat resistance of polyimides results from their rigid backbones and restricted intramolecular rotation. Polyazomethines made by polycondensation of dialdehyde and diamine are also heat-resistant polymers that have similar rigid backbones. The compounds have attracted much attention as a new heat-resistant material.

One drawback of polyazomethines, however, is that polyazomethines with a high degree of polymerization are difficult to obtain because the polymers tend to precipitate at an early stage of polycondensation due to their rigid structure, resulting in the formation of polymers with a low degree of polymerization (See, Non-Patent Document 1). Polyazomethine polymer chains with a low degree of polymerization do not tangle with each other, so that when such a polymer is cast into a film, the film has a decreased toughness and become susceptible to cracking. For this reason, few studies have ever reported the properties of polyazomethine films.

One approach to increase the degree of polymerization of polyazomethine is the use of a fluorinated monomer or a bent monomer in the synthesis of polyazomethine. Addition of these monomers serves to decrease the intermolecular force of the polymer and, thus, increase the solubility of polyazomethine in the polymerization system (See, Non-Patent Document 2, Patent Document 1 and Patent Document 2). It is expected that this approach decreases the precipitation of polyazomethine at an early stage of polymerization.

In recent years, reducing the thermal expansion of heat-resistant insulating films has become an important issue for the following reasons. For example, when a polyimide insoluble in common ordinary solvents is used to make a polyimide film, a soluble precursor of the polyimide is first dissolved in an amide organic solvent and the solution is applied to a metal substrate, which in turn is dried and subjected to thermal dehydration ring closure reaction (imidization reaction) at 250° C. to 350° C. to form a polyimide film. As the polyimide/metal substrate laminate is cooled from the imidization temperature to room temperature, thermal stress is generated, causing the film to curl, peel or crack. Even if the film does not peel or crack, the residual stress significantly decreases the reliability of devices, such as multilayer wiring boards that are increasingly used today as electrical circuits become highly integrated. The stress generated during the imidization process tends to increase when the difference in the linear thermal expansion coefficient between the metal substrate and the polyimide film is large or when the imidization temperature is high. Thus, it is important to minimize the thermal expansion of heat-resistant insulating films.

With regard to reducing the thermal expansion of polyimides, common polyimides have a linear thermal expansion coefficient of 50 to 90 ppm/K, which is significantly larger than that of metal substrates, for example, copper substrates have a linear thermal expansion coefficient of 17 ppm/K. Therefore, studies have been conducted in an effort to decrease the thermal expansion coefficient of polyimides to a value close to the linear thermal expansion coefficient of copper, e.g., 20 ppm/K or less (Non-Patent Document 3). One such study suggested that polyimides with a low thermal expansion must have a linear backbone structure and its internal rotation must be restricted to make the molecule rigid.

One of the most well-known among the practical low thermal expansion polyimide materials is a polyimide made from 3,3',4,4'-biphenyltetracarboxylic dianhydride and paraphenylenediamine. This polyimide film has an extremely low linear thermal expansion coefficient of 5 to 10 ppm/K while the value may vary depending on the film thickness and the conditions for making the film (Non-Patent Document 4).

Several other polyimide systems showing a low thermal expansion property are known, each of which has a linear, rigid backbone. For example, in addition to the 3,3',4,4'-biphenyltetracarboxylic dianhydride, pyromellitic dianhydride and 1,2,3,4-cyclobutanetetracarboxylic dianhydride may be used as the tetracarboxylic acid dianhydride, while in addition to the p-phenylenediamine, 2,2'-bis(trifluoromethyl) benzidine, trans-1,4-cyclohexanediamine, o-tolidine and m-tolidine may be used as the diamine. These tetracarboxylic acid dianhydrides and the diamines may be used in combination to make polyimide systems having a low thermal expansion coefficient.

The exhibition of low thermal expansion coefficient by these polyimide films is based upon imidization-induced spontaneous in-plane orientation. Specifically, when a polyimide precursor is cast onto a substrate, the initially low degree of in-plane orientation of the molecules increases rapidly during the thermal imidization (See, Non-Patent Document 4).

Highly linear and rigid backbones are also essential for polyazomethine systems to exhibit a low thermal expansion property. However, the combination of terephthalaldehyde and p-phenylenediamine results in the polymer product precipitating at an early stage of polymerization, as described above, making it difficult to obtain the polymer with a high degree of polymerization.

2,2'-bis(trifluoromethyl)benzidine, a rigid fluorinated diamine represented by the following formula (d), can be reacted with a terephthalaldehyde in m-cresol to obtain a polyazomethine high polymer (See, Non-Patent Document 5). However, the film obtained by casting the polymer is whitish opaque and is extremely brittle.

Bent amines as shown by the following formulas (e) and (f) may be added to the reaction system in amounts small enough not to affect the linearity and rigidity of the polymer backbone. The presence of these amines in the polyazomethine copolymer significantly increases the toughness of the resulting polyazomethine cast film (See, Non-Patent Document 5).

However, the rigid polyazomethine copolymer film obtained by using 2,2'-bis(trifluoromethyl)benzidine of the formula (d) as the diamine component and a terephthalaldehyde has a high linear expansion coefficient of 90 ppm/K, failing to achieve the desired low thermal expansion property (Non-Patent Document 5). This means that evaporating the solvent during the solution casting alone is not enough to induce high in-plane orientation of the molecules even if the polymer backbone is linear and rigid.

In recent years, much effort has been put into the study and development of photosensitive polyimides (or precursor polymers thereof) that can significantly shorten the time required for the fine patterning of polyimide films. If the photosensitivity can be added to the polyimide systems that already have properties not seen in common polyimides, such as low dielectric constant, low thermal expansion and high glass transition point, such polyimide systems should serve as a highly useful material in the relevant industrial fields.

As environmental issues become a greater concern, needs are shifting from negative photosensitive polyimide precursors, which are developed by organic solvents, to positive photosensitive polyimide precursors, which are developed by alkaline solutions. Although polyimide precursors (i.e., polyamic acids) are by nature soluble in alkali solutions, they can be made insoluble in alkaline solutions by dispersing a diazonaphthoquinone photosensitizer (which serves as a solubilization suppressant) in the polyamic acid film. When the alkali-insoluble polyimide precursor is exposed to UV rays via a photomask, the diazonaphthoquinone photosensitizer undergoes a photoreaction and is converted to an alkali-soluble indene carboxylic acid in the exposed area. In this manner, only the exposed area is made soluble in aqueous alkali solutions, making the positive patterning possible.

However, the solubility of polyamic acid in an aqueous tetramethylammonium hydroxide solution, a common alkali developer for semiconductor photoresists, is so high that the effect of the solubilization suppressant becomes insufficient. In many cases, this makes the formation of sharp patterns difficult. For this reason, it is necessary to chemically modify the structure of polyamic acid to control its solubility in aqueous alkali solutions.

In addition to controlling the solubility of polyamic acid, the transparency of the polyamic acid film is also important. When the polyamic film is exposed to the i-ray (365 nm) of a high pressure mercury lamp, the polyamic acid film needs to have a sufficiently high transmittance to the wavelength of i-ray. Otherwise, the irradiation is blocked by polyamic acid and does not reach the photosensitizer, so that the exposure takes undesirably long or, in an extreme case, the photoreaction of the photosensitizer is interrupted, resulting in the failure of patterning.

As described above, polyimide films made from 3,3',4,4'-biphenyltetracarboxylic dianhydride and p-phenylenediamine are well known as low thermal expansion polyimides. However, the precursor polyamic acid film blocks the irradiation and shows virtually 0% transmittance to the i-ray. Thus, the polyamic acid film is unsuitable for use in photopatterning.

In contrast, polyamic acid films made from 3,3',4,4'-biphenyltetracarboxylic dianhydride and trans-1,4-cyclohexanediamine have a very high i-ray transmittance (See, Patent Document 3). In addition, the polyimide films obtained by curing these polyamic acid films exhibit different properties in a well-balanced manner, including low thermal expansion, low dielectric constant, and high glass transition temperature (See, Non-Patent Documents 6 and 7). However, these polyimide precursors also have an excessively high solubility in aqueous alkali solutions and are unsuitable for use in photopatterning. Thus, practical techniques are sought to make these precursors suitable for photopatterning.

Likewise, practical approaches are needed to impart to the highly heat-resistant polyazomethine systems such favorable properties as low thermal expansion, low dielectric constant, and high glass transition temperature, in a well-balanced manner, and thereby make the polyazomethine systems suitable for use in photopatterning.

Non-Patent Document 1 Yuki Kagaku Gosei (Synthetic Organic Chemistry), vol. 41, 1983, pp. 972-984

Non-Patent Document 2 Macromolecular Chemistry and Physics, vol. 195, 1994, pp. 1877-1889

Non-Patent Document 3 Polymer, vol. 28, 1987, pp. 2282-2288

Non-Patent Document 4 Macromolecules, vol. 29, 1996, pp. 7897-7909

Non-Patent Document 5 Preprint of the Annual Conference of the Society of Polymer Science, Japan, vol. 52, No. 6, 1996, p. 1295

Non-Patent Document 6 High Performance Polymers, vol. 13, 2001, pp. S93-S106

Non-Patent Document 7 High Performance Polymers, vol. 15, 2003, pp. 47-64

Patent Document 1 Japanese Patent Application Laid-Open No. Sho 64-79233

Patent Document 2 Japanese Patent Application Laid-Open No. Hei 2-42372

Patent Document 3 Japanese Patent Application Laid-Open No. 2002-161136

DISCLOSURE OF THE INVENTION

Problems to be Solved by the Invention

Accordingly, it is an object of the present invention to provide a poly(imide-azomethine)copolymer having a low linear thermal expansion coefficient and a method for producing such a copolymer. It is another object of the present invention to provide a poly(amic acid-azomethine)copolymer, which serves as a precursor of the poly(imide-azomethine)copolymer, as well as a positive photosensitive resin composition comprising the poly(amic acid-azomethine)copolymer and a photosensitizer. It is still another object of the present invention to provide a method for forming fine patterns of the poly(imide-azomethine) copolymer from the positive photosensitive resin composition.

Means for Solving the Problems

The present inventors have found that the above-described objects can be achieved by introducing amic acid residues in polyazomethine to serve as the site for intramolecular cyclization. This discovery ultimately led to the present invention.

Specifically, the present invention provides a poly(imide-azomethine)copolymer comprising azomethine polymer units of the following formula (1) and imide polymer units of the following general formula (2):

(1)

(2)

(wherein in the formulas (1) and (2), A and D are each independently a divalent aromatic or aliphatic group, and B is a tetravalent aromatic or aliphatic group).

The present invention further provides a method for producing the above-described poly(imide-azomethine) copolymer, comprising:

mixing together a diamine of the following formula (a), an acid dianhydride of the following formula (b), and a dialdehyde of the following formula (c):

(a)

(b)

(c)

wherein in the formulas (a), (b) and (c), A and D are each independently a divalent aromatic or aliphatic group, and B is a tetravalent aromatic or aliphatic group) to allow the components to polymerize to form a poly(amic acid-azomethine) copolymer comprising azomethine polymer units of the following formula (1) and amic acid polymer units of the following formula (3):

(1)

(3)

wherein in the formulas (1) and (3), A and D are each independently a divalent aromatic or aliphatic group, and B is a tetravalent aromatic or aliphatic group; and subjecting the resulting poly(amic acid-azomethine)copolymer to an imidization process to obtain the poly(imide-azomethine)copolymer.

The present invention further provides a poly(amic acid-azomethine)copolymer that serves as a precursor polymer of the above-described poly(imide-azomethine)copolymer, the poly(amic acid-azomethine) copolymer comprising azomethine polymer units of the following formula (1) and amic acid polymer units of the following formula (3):

(1)

(3)

wherein in the formulas (1) and (3), A and D are each independently a divalent aromatic or aliphatic group, and B is a tetravalent aromatic or aliphatic group.

The present invention further provides a positive photosensitive resin composition comprising the above-described poly (amic acid-azomethine)copolymer and a diazonaphthoquinone photosensitizer.

The present invention further provides a method for forming a fine pattern of a poly(imide-azomethine) copolymer, comprising:

forming the positive photosensitive resin composition into a film;

exposing the film of the positive photosensitive resin composition to a pattern of light;

developing the exposed film in an alkali solution; and subjecting the developed film to a polyimidization process to form a desired fine pattern.

Advantages of the Invention

The poly(imide-azomethine)copolymer of the present invention is obtained by imidization of a poly(amic acid-azomethine) copolymer, a polyimide precursor that has amic acid residues introduced in it to serve as the site for intramolecular cyclization. The poly(imide-azomethine) copolymer of the present invention undergoes a reduced thermal expansion. The poly(amic acid-azomethine) copolymer can be combined with a photosensitizer to make a resin composition that has a high photosensitivity so that it can be exposed to light to form a desired pattern. The resin composition is a positive photosensitive resin composition that can be developed in an alkali solution. The positive photosensitive resin composition can be used to form fine patterns of the poly(imide-azomethine)copolymer that have a relatively low dielectric constant, relatively low thermal expansion coefficient, and relatively high glass transition temperature.

BRIEF DESCRIPTION OF THE DRAWINGS

FIG. 1 is an IR spectrum of poly(amic acid-azomethine) polymer obtained in Experiment 1a.

FIG. 2 is an IR spectrum of poly(imide-azomethine)polymer obtained by imidization of the poly(amic acid-azomethine)polymer of Experiment 1a.

BEST MODE FOR CARRYING OUT THE INVENTION

The present invention will now be described in detail.

The poly(imide-azomethine)copolymer of the present invention is composed of the azomethine polymer units of the formula (1) and the imide polymer units of the formula (2), as previously described. The copolymer not only shows a high heat resistance, but it also exhibits other favorable properties in a well-balanced manner: a low thermal expansion of less than 30 ppm/K, a low dielectric constant and a high glass transition temperature of 250° C. or above. Furthermore, the amic acid residues present in the unimidized precursor molecule, together with a diazonaphthoquinone photosensitizer, make it possible to form a positive photosensitive resin composition suitable for use in photopatterning.

The molar fractions of the azomethine polymer units of the formula (1) and the imide polymer units of the formula (2) in the poly(imide-azomethine)copolymer of the present invention are adjusted to preferred ranges since one component present in significantly smaller amounts than the other may pose problems. For example, imide residues when present in too small amounts cannot provide the low thermal expansion property, whereas azomethine residues present in too small amounts may result in the failure of positive photopatterning. Given that the molar fraction of the formula (1) is X and the molar fraction of the formula (2) is 1-X, it is preferred that X falls within the range of 0.05 to 0.95 and more preferably, within the range of 0.1 to 0.9.

As previously described, each of the substituents A and D in the azomethine polymer unit of the formula (1) and the imide polymer unit of the formula (2) represents a divalent aromatic or aliphatic group. The substituent B represents a tetravalent aromatic or aliphatic group.

The divalent aromatic or aliphatic group for the substituent A is a residue derived from fluorine-containing diamines. Specifically, the residue is a fluorine-containing diamine with the two amino groups eliminated. Particularly preferred substituents A are residues derived from 2,2'-bis(trifluoromethyl) benzidine above-mentioned which is a fluorine-containing diamine. A residue derived from the bent fluorine-containing diamine of the formula (e) or the formula (f) may be used with the residue derived from the diamine of the formula (d). In such a case, care must be taken when the residue derived from the fluorine-containing diamine of the formula (e) or the formula (f) is used in excessive amounts since these residues if present in too large an amount will lead to a significant increase in the linear thermal expansion coefficient of the poly(imide-azomethine)copolymer. The proportion of the diamine of the formula (d) in the total diamine content is at least 50 mol %.

Aside from the residues derived from fluorine-containing diamines, residues derived from the following aromatic or aliphatic diamines may be used as the divalent aromatic or aliphatic group for the substituent A. These residues are used in specific amounts so that they do not significantly affect the polymerization reactivity of the poly(amic acid-azomethine) copolymer or the required properties of the poly(imide-azomethine)copolymer film.

Examples of the residues for the substituent A derived from aromatic diamines include those derived from p-phenylenediamine, m-phenylenediamine, 2,4-diaminotoluene, 2,5-diaminotoluene, 2,4-diaminoxylene, 2,4-diaminodulene, 4,4'-diaminodiphenylmethane, 4,4'-methylenebis(2-methylaniline), 4,4'-methylenebis(2-ethylaniline), 4,4'-methylenebis(2,6-dimethylaniline), 4,4'-methylenebis(2,6-diethylaniline), 4,4'-diaminodiphenyl ether, 3,4'-diaminodiphenyl ether, 3,3'-diaminodiphenyl ether, 2,4'-diaminodiphenyl ether, 4,4'-diaminodiphenylsulfone, 3,3'-diaminodiphenylsulfone, 4,4'-diaminobenzophenone, 3,3'-diaminobenzophenone, 4,4'-diaminobenzanilide, benzidine, 3,3'-dihydroxybenzidine, 3,3'-dimethoxybenzidine, o-tolidine, m-tolidine, 1,4-bis(4-aminophenoxy)benzene, 1,3-bis(4-aminophenoxy)benzene, 1,3-bis(3-aminophenoxy)benzene, 4,4'-bis(4-aminophenoxy)biphenyl, bis(4-(3-aminophenoxy)phenyl)sulfone, bis(4-(4-aminophenoxy)phenyl)sulfone, 2,2-bis(4-(4-aminophenoxy)phenyl) propane, 2,2-bis(4-aminophenyl)propane and p-terphenylenediamine. Two of more of these residues may be used in combination.

Examples of the residues for the substituent A derived from aliphatic diamines include those derived from trans-1,4-diaminocyclohexane, cis-1,4-diaminocyclohexane, 1,4-diaminocyclohexane(trans/cis mixture), 1,3-diaminocyclohexane, isophoronediamine, 1,4-cyclohexanebis(methylamine), 2,5-bis(aminomethyl)bicyclo[2.2.1]heptane, 2,6-bis(aminomethyl)bicyclo[2.2.1]heptane, 3,8-bis(aminomethyl)tricycle [5.2.1.0]decane, 1,3-diaminoadamantane, 4,4'-methylenebis (cyclohexylamine), 4,4'-methylenebis(2-methylcyclohexylamine), 4,4'-methylenebis(2-ethylcyclohexylamine), 4,4'-methylenebis(2,6-dimethylcyclohexylamine), 4,4'-methylenebis(2,6-diethylcyclohexylamine), 2,2-bis(4-aminocyclohexyl) propane, 2,2-bis(4-aminocyclohexyl)hexafluoropropane, 1,3-propanediamine, 1,4-tetramethylenediamine, 1,5-pentamethylenediamine, 1,6-hexamethylenediamine, 1,7-heptamethylenediamine, 1,8-octamethylenediamine and 1,9-nonamethylenediamine. Two of more of these residues may be used in combination.

The tetravalent aromatic or aliphatic groups for the substituent B are derived from tetracarboxylic acid dianhydrides. Specifically, these residues are each a tetracarboxylic acid dianhydride with the four carboxyl groups eliminated. Particularly preferred substituents B are residues derived from pyromellitic acid dianhydride, 3,3',4,4'-biphenyltetracarboxylic dianhydride or 1,2,3,4-cyclobutanetetracarboxylic dianhydride since such residues can impart to the poly(imide-azomethine)copolymer favorable properties including low linear thermal expansion coefficient, high glass transition temperature, and high toughness. These residues may be used in combination.

Aside from the residues derived from tetracarboxylic acid dianhydrides, residues derived from the following acid dianhydrides may be used as the tetravalent aromatic or aliphatic group for the substituent B. These residues are used in specific amounts so that they do not significantly affect the polymerization reactivity of the poly(amic acid-azomethine)copolymer or the required properties of the poly(imide-azomethine) copolymer film.

Examples of the tetravalent acid dianhydride for the substituent B include 3,3',4,4'-benzophenone tetracarboxylic dianhydride, 3,3',4,4'-biphenylether tetracarboxylic dianhydride, 3,3',4,4'-biphenylsulfone tetracarboxylic dianhydride, 2,2'-bis(3,4-dicarboxyphenyl)hexafluoropropanoic dianhydride, 2,2'-bis(3,4-dicarboxyphenyl)propanoic dianhydride and 1,4,5,8-naphthalene tetracarboxylic dianhydride. These dianhydrides may be used as copolymer components either individually or in combination of two or more.

The divalent aromatic or aliphatic group for the substituent D is a residue derived from dialdehydes. Specifically, the residue is a dialdehyde with the two aldehyde groups eliminated. Particularly preferred substituents D are residues derived from terephthalaldehydes.

Aside from the residues derived from terephthalaldehydes, residues derived from other dialdehydes may be used as the divalent aromatic group for the substituent D. These residues are used in specific amounts so that they do not significantly affect the required properties. Examples of the residues derived from other aldehydes include, but are not limited to, those derived from isophthalaldehyde, 4,4'-diphenylether dialdehyde, 4,4'-diphenylmethane dialdehyde, 4,4'-diphenylsulfone dialdehyde, 1,5-naphthalene dialdehyde and 2,6-naphthalene dialdehyde.

The divalent aliphatic group for the substituent D is a residue derived from aliphatic dialdehydes. The aliphatic dialdehydes include straight-chained or branched aliphatic dialdehydes, such as 1,6-hexanedial, as well as alicyclic dialdehydes. Preferred divalent aliphatic groups for the substituent D include cyclohexane-1,2-dialdehyde, cyclohexane-1,3-dialdehyde, cyclohexane-1,4-dialdehyde, cyclooctane-1,2-dialdehyde and cyclooctane-1,5-dialdehyde.

Alicyclic dialdehydes can be produced as follows: An aliphatic dihalide having a ring structure as a starting material is converted to a magnesium compound (Grinard reagent) or lithium compound, which in turn is reacted with a proper starting material for formylation. When the aliphatic dihalide is cis/trans-1,4-dibromocyclohexane, a 6-membered aliphatic ring, cyclohexane-1,4-dialdehyde can be synthesized by the pathway shown below. The aliphatic dihalide may be cis/trans-1,2-dibromocyclohexane or cis/trans-1,3-dibromocyclohexane, each a positional isomer. Aliphatic dihalides with a ring structure having a different number of constituent atoms may also be used. For example, cis/trans-1,5-dibromocyclooctane, an 8-membered aliphatic ring, may be converted in the pathway shown below to an alicyclic dialdehyde. Again, a positional isomer such as cis/trans-1,2-dibromocyclooctane may be used to make the same product (See, G. Boss and H. Gerlach, Chem. Ber., 1989, 1199.)

The above-described poly(imide-azomethine)copolymer of the present invention can be produced by the following process involving Step (I) and Step (II).

Step (I)

A diamine of the formula (a), an acid dianhydride of the formula (b), and a dialdehyde of the formula (c) are mixed and polymerized together to make a poly(amic acid-azomethine) copolymer composed of azomethine polymer units of the formula (1) and amic acid polymer units of the formula (3). The substituents A, B, and D in the formulas (a), (b), (c) and the formula (3) are as described with reference to the formulas (1) and (2). Thus, the diamine of the formula (a) is composed of the substituent A in the formula (1) bound to two amino groups. The acid dianhydride of the formula (b) is an anhydride composed of the substituent B in the formula (2) bound to four carboxyl groups. The dialdehyde of the formula (c) is composed of the substituent D of the formula (1) bound to two aldehyde groups.

Specifically, a diamine of the formula (a), such as 2,2'-bis (trifluoromethyl)benzidine, is dissolved in a solvent, such as N-methyl-2-pyrrolidone. To the solution, an acid dianhydride of the formula (b), such as pyromellitic dianhydride, is slowly added and the mixture is stirred for 30 min to several hours to form a clear solution. Subsequently, a dialdehyde of the formula (3), such as terephthalaldehyde powder, is slowly added and the mixture is stirred preferably at room temperature for several hours to several days to allow the components to polymerize. This gives a uniform viscous solution of poly (amic acid-azomethine)copolymer. The poly(amic acid-azomethine) copolymer preferably has a specific viscosity of 0.1 dL/g or higher (as measured by Ostwald viscometer for poly(amic acid-azomethine) in N-methyl-2-pyrrolidone (0.5 wt %)) at 30° C. to ensure the film toughness.

The resulting solution of poly(amic acid-azomethine) copolymer may be directly used in the subsequent Step (II) or it may be blended with a photosensitizer to make a positive photosensitive resin composition, as will be described later. When the poly(amic acid-azomethine)copolymer is polymerized in a toxic or non-volatile solvent, such as m-cresol, the polymerization solution is properly diluted and added dropwise to a poor solvent such as methanol, diethylether and toluene to crystallize the poly(amic acid-azomethine) copolymer. The product is washed and dried to make a powder, which then is dissolved in a solvent such as N-methyl-2-pyrrolidone. The resulting solution may be used in Step (II).

In this step, the total molar amount of the acid dianhydride of the formula (b) and the dialdehyde of the formula (c) used for polymerization is equal to the total molar amount of the diamine of the formula (a). Given that the molar fraction of azomethine polymer units of the formula (1) is X and the molar fraction of amic acid-polymer units of the formula (3) is 1-X, X may be adjusted to the range of 0.05 to 0.95 by controlling these molar ratios.

While the degree of polymerization of the polymer tends to increase as the total monomer concentration of the diamine of the formula (a), the acid anhydride of the formula (b) and the dialdehyde of the formula (c) in the polymerization solution is increased, the total monomer concentration is typically in the range of 5 to 50 wt %, and preferably in the range of 10 to 40 wt % since too high a concentration causes the polymer to precipitate.

While solvents such as N-methyl-2-pyrrolidone, m-cresol and N,N-dimethylacetamide are suitable for use in this step, other solvents may also be used, including aprotic solvents, such as N,N-diethylacetamide, N,N-dimethylformamide, hexamethylphosphoramide, dimethylsulfoxide, γ-butyrolactone, 1,3-dimethyl-2-imidazolidinone, 1,2-dimethoxyethane-bis(2-methoxyethyl)ether, tetrahydrofuran, 1,4-dioxane, picoline, pyridine, acetone, chloroform, toluene, and xylene; and protic solvents, such as phenol, o-cresol, p-cresol, o-chlorophenol, m-chlorophenol and p-chlorophenol. These solvents may be used either individually or as a mixture of two or more.

(Step II)

Subsequently, the resulting poly(amic acid-azomethine) copolymer is subjected to an conventional imidization process to obtain a poly(imide-azomethine)copolymer.

Specifically, the poly(amic acid-azomethine) copolymer dissolved in an organic solvent is formed into a film using a spin-coater or other common applicators. The resulting film of the poly(amic acid-azomethine) copolymer is imidized by heating at 200° C. to 430° C., preferably at 250° C. to 400° C., either in the air, in an inert gas atmosphere, or in vacuo to make a film of poly(imide-azomethine)copolymer. Alternatively, the imidization may be carried out by immersing the poly(amic acid-azomethine)copolymer film in an acetic anhydride containing a basic catalyst, such as pyridine and triethylamine, preferably at room temperature for 1 min to several hours. When necessary, an oxidation stabilizer, an end-capping agent, a filler, a silane-coupling agent, a photosensitizer, a photopolymerization initiator, a sensitizer, and other additives may be added to the organic solvent solution of the poly(amic acid-azomethine) copolymer.

A positive photosensitive resin composition using the poly (amic acid-azomethine)copolymer obtained in Step (I) is now described.

The positive photosensitive resin composition contains the poly(amic acid-azomethine)copolymer obtained in Step (I) and a diazonaphthoquinone photosensitizer. Although the poly(amic acid-azomethine)copolymer to serve as the polyimide precursor is by nature soluble in alkali solutions, the film that has the diazonaphthoquinone photosensitizer dispersed in it is insoluble in alkaline solutions since the diazonaphthoquinone photosensitizer acts as a solubilization suppressant. When the film is exposed to UV rays through a photomask, the diazonaphthoquinone photosensitizer undergoes a photoreaction and is converted to an alkali-soluble indene carboxylic acid in the exposed area. As a result, only the exposed area becomes soluble in aqueous alkali solutions, making the positive patterning possible.

Specific examples of the diazonaphthoquinone photosensitizer include low-molecular-weight hydroxyl compounds of 1,2-naphthoquinone-2-diazide-5-sulfonic acid and 1,2-naphthoquinone-2-diazide-4-sulfonic acid, and for example, esters of 2,3,4-trihydroxybenzophenone, 1,3,5-trihydroxybenzene, 2- or 4-methyl-phenol, and 4,4'-hydroxy-propane.

The content of the diazonaphthoquinone photosensitizer in the positive photosensitive resin composition is preferably in the range of 10 to 40% by weight, and more preferably in the range of 20 to 30% by weight, with respect to the amount of the poly(amic acid-azomethine) copolymer. If the constant of the diazonaphthoquinone photosensitizer is too small, then the difference in the solubility between the exposed and the non-exposed areas becomes too small to allow the development of desired patterns. Conversely, if too much of the diazonaphthoquinone photosensitizer is present, the agent may adversely affect the physical properties of the poly (imide-azomethine)film (e.g., toughness, linear thermal expansion coefficient, glass transition temperature and heat resistance) and the film thickness may be significantly reduced after imidization.

When necessary, the positive photosensitive resin composition may contain any of the aforementioned organic solvents used in Step (I).

The positive photosensitive resin composition can be produced by adding the diazonaphthoquinone photosensitizer to the organic solvent solution of the poly(amic acid-azomethine) copolymer obtained in Step (I).

A method for producing a fine pattern of the poly(imide-azomethine)copolymer using the positive photosensitive resin composition is now described.

First, the positive photosensitive resin composition is made into a film. Specifically, the positive photosensitive resin composition is diluted with a solvent and is applied to a copper, silicone, or glass substrate using a spin coater or a bar coater. The substrate is then dried in a dark environment at 40 to 100° C. for 0.1 to 3 hours by blowing a stream of hot air. This gives a 1 to 5 μm-thick photosensitive film of the poly (amic acid-azomethine) copolymer. It is preferred that the film-forming process is carried out at a temperature of 100° C. or below since the diazonaphthoquinone photosensitizer may begin to thermally decompose at higher temperatures. To remove the residual solvent in the copolymer film, the film may be prebaked at 80 to 100° C. for 1 to 30 min or it may be immersed in water for 1 to 5 min. The residual solvent may cause swelling of the film or formation of defective patterns during the development and is thus preferably removed as much as possible to ensure formation of sharp patterns.

Subsequently, the photosensitive film of the poly(amic acid-azomethine)copolymer is exposed to a pattern of light and is then developed in an alkali solution. The developed pattern is subjected to a polyimidization process to obtain a desired fine pattern of poly(imide-azomethine)copolymer.

Specifically, the photosensitive film of the poly(amic acid-azomethine)copolymer is exposed to an i-ray from a high-pressure mercury lamp via a photomask. The exposure is carried out at room temperature for 10 sec to 1 hour. The exposed film is then developed in a 0.05 to 10 wt %, preferably 0.1 to 5 wt % aqueous solution of tetramethylammonium hydroxide at room temperature for 10 sec to 10 min. Subsequently, the developed film is rinsed with pure water to form a desired sharp positive pattern. The fine pattern of the poly (amic acid-azomethine) copolymer formed on the substrate is then subjected to a thermal imidization process at 200° C. to 430° C., preferably 250° C. to 400° C., either in the air, in an inert gas atmosphere, or in vacuo to make a sharp fine pattern of poly(imide-azomethine)copolymer that has a linear thermal expansion coefficient of less than 30 ppm/K and a glass transition temperature of 250° C. or above.

Alternatively, the imidization may be carried out chemically by using a dehydrative cyclization reagent. For example, the poly(amic acid-azomethine)copolymer film formed on the substrate may be immersed in acetic anhydride containing a basic catalyst, such as pyridine and triethylamine, at room temperature for 1 min to several hours to obtain the desired poly(imide-azomethine) copolymer film.

EXAMPLES

The present invention will now be described in further detail with reference to examples, which are not intended to limit the scope of the invention in any way. The following analyses were conducted in Examples and Comparative Examples.

"Specific Viscosity ($[\eta]$dL/g)"

Using an Ostwald viscometer at 30° C., a 0.5 wt % solution of a polyimide precursor (i.e., poly(amic acid-azomethine) copolymer) was analyzed for the specific viscosity. A polyimide precursor preferably has a specific viscosity of 0.1 dL/g or higher to ensure the toughness of the film.

"Glass Transition Temperature (Tg)"

The glass transition temperature of a polyimide (i.e., poly (imide-azomethine)copolymer) film was determined from the loss peak of the dynamic viscoelasticity analysis (frequency=0.1 Hz, temperature increased at a rate of 5° C./min). A polyimide film preferably has a glass transition temperature (Tg) of 250° C. or higher to ensure heat resistance during soldering.

"5% Weight Loss Temperature ($Td^5$)"

A polyimide (i.e., poly(imide-azomethine)copolymer) film was analyzed by thermogravimetry performed in nitrogen atmosphere or in the air to determine the temperature at which the weight of the film was decreased by 5%. A polyimide film preferably has a 5% weight loss temperature ($Td^5$) of 400° C. or higher to ensure heat resistance.

"Coefficient of Linear Thermal Expansion (CTE)"

A thermomechanical analysis was conducted in which a sample piece was stretched by a load of 0.5 g/1 μm thickness while the temperature was increased at a rate of 5° C./min. The amount of stretch measured over a range of 100 to 200° C. was averaged to determine the coefficient of linear thermal expansion for the sample piece. A sample piece preferably has a coefficient of linear thermal expansion (CTE: [ppm/K]) of less than 30 ppm/K to minimize the residual stress of insulating film/metal substrate used in electronic devices.

"Birefringence (Δn)"

Using an Abbe refractometer (sodium lamp; wavelength=589 nm), the refraction indices of a polyimide were determined parallel ($n_{in}$) and perpendicular ($n_{out}$) to the polyimide film. The birefringence was determined as the difference between the two refractive indices ($\Delta n = n_{in} - n_{out}$). A large birefringence indicates a large degree of in-plane orientation of polymer chains.

"Dielectric Constant (∈)"

Using the average refractory index of a polyimide film [$n_{av} = (2n_{in} + n_{out})/3$], the dielectric constant at 1 MHz was calculated from the equation: $\in = 1.1 \times (n_{av})^2$. A polyimide film preferably has as small a dielectric constant (∈) as possible (e.g., 3.0 or less) to ensure high speed transmission of electrical signals in electronic devices.

Example 1

Figure 1:
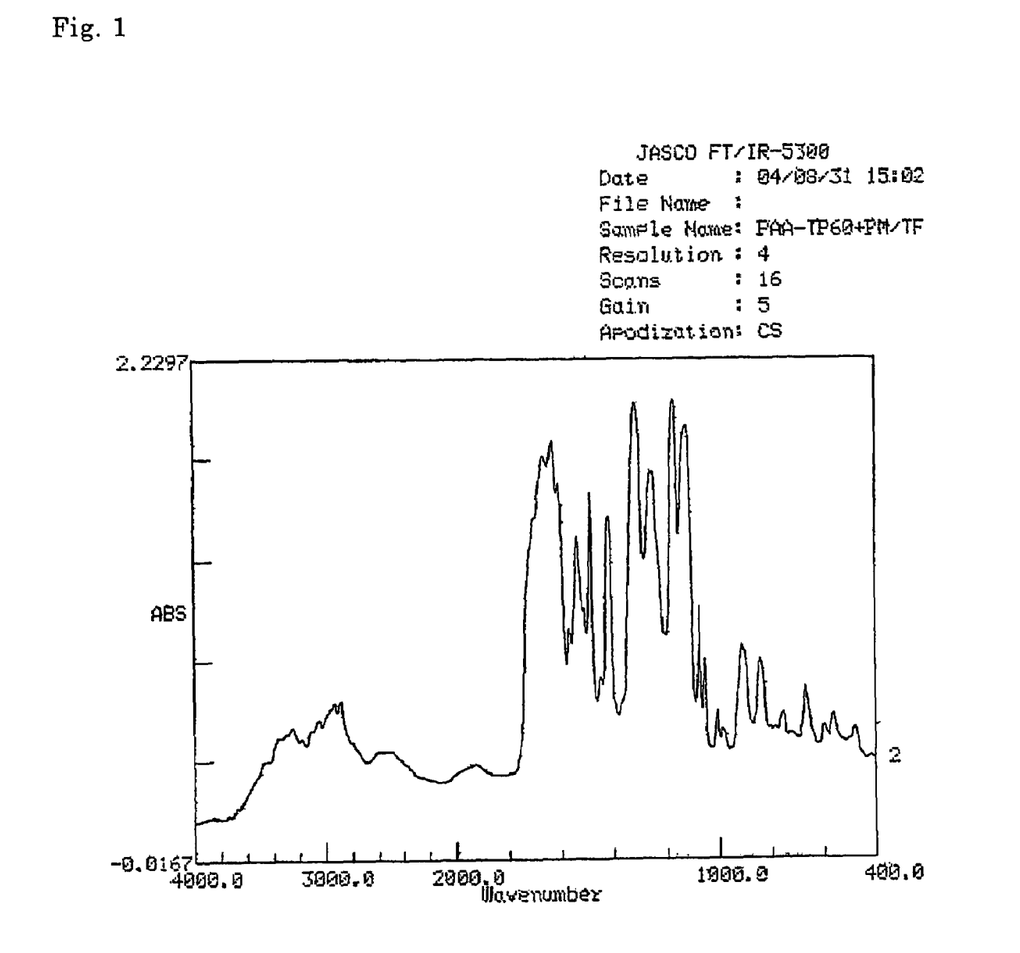

Experiments 1a through 1e 2,2'-bis(trifluoromethyl)benzidine (5 mmol) was dissolved in a thoroughly dehydrated N-methyl-2-pyrrolidone (NMP) or m-cresol in a dry, sealed reaction vessel equipped with a stirrer. To this solution, a pyromellitic dianhydride (2 mmol, molar fraction [1−X]=0.4) powder was slowly added and the mixture was stirred at room temperature for 30 min to several hours. To the resulting mixture, a terephthalaldehyde powder (3 mmol, molar fraction [X]=0.6) was added and the mixture was further stirred at room temperature for 24 hours to form a uniform viscous poly(amic acid-azomethine)copolymer. The polymerization was carried out at a monomer concentration shown in Table 1 (i.e., X=0.6 to 0.9). The resultant poly(amic acid-azomethine)copolymer was analyzed for the specific viscosity in N-methyl-2-pyrrolidone (NMP) at 30° C. The IR spectrum of the poly(amic acid-azomethine)copolymer is shown in FIG. 1 (characteristic absorption by azomethine at 1620 to 1630 cm$^{-1}$; characteristic absorption by carboxylic groups of amic acid near 2600 cm$^{-1}$ (broad)).

The poly(amic acid-azomethine)copolymer solution was then poured onto the surface of a glass substrate and was allowed to flow along the surface. Drying the copolymer solution at 60° C. for 2 hours resulted in a somewhat fragile film of poly(amic acid-azomethine)copolymer. The poly (amic acid-azomethine)copolymer film formed on the substrate was then thermally imidized under reduced pressure at 250° C. for 2 hours, followed by additional heating at 330° C. to 350° C. for 1 hour. This gave 10 to 20 μm-thick strong transparent film of poly(imide-azomethine) copolymer.

Figure 2:
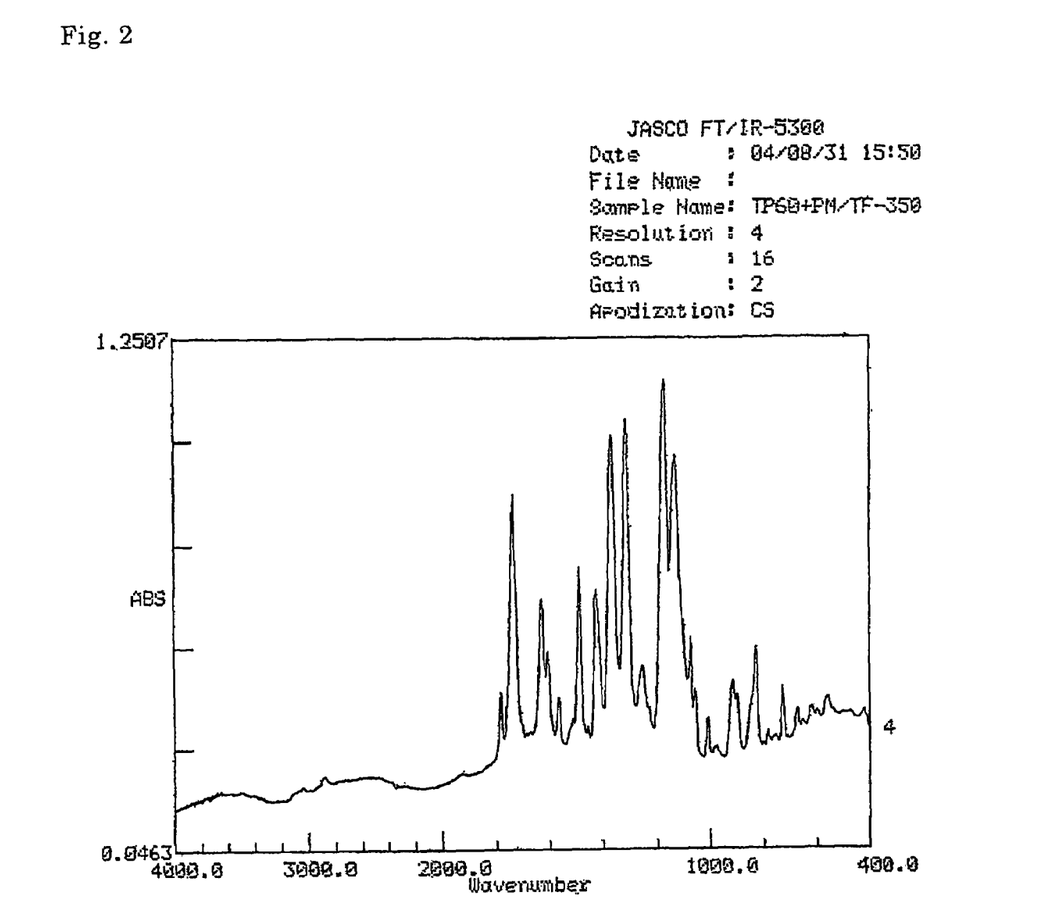

The IR spectrum shown in FIG. 2 indicates that the thermal imidization was almost completed during the thermal imidization process at 250° C. for 2 hours (disappearance of characteristic absorption by carboxyl groups of amic acid; characteristic absorption by imide carbonyl at 1780 cm$^{-1}$; characteristic absorption by azomethine at 1620 to 1630 cm$^{-1}$). No significant change was observed in IR spectrum during the subsequent heat treatment at 330° C. or 350° C. for 1 hour, suggesting that virtually no structural changes had occurred during the heat treatment at 350° C. The heat treatment drastically increased the film toughness, however. This is considered to be because the high temperature heat treatment promoted the solid phase polymerization between the terminal groups (elongation of polymer chains), leading to an increased molecular weight. The analysis of various film properties was conducted as described above. The results indicated that each of the poly(imide-azomethine)copolymer films obtained in Experiments 1a, 1b and 1d had the required properties: each exhibited a relatively low linear thermal expansion coefficient and a relatively high glass transition temperature. The polymerization conditions for each of the copolymer compositions ([X]=0.6 to 0.9) are shown in Table 1, along with the specific viscosity of each copolymer (Polymerization condition and specific viscosity of poly(amic acid-azomethine)copolymers). The film properties are shown in Table 2 (Physical properties of poly(imide-azomethine) copolymer films). The poly(imide-azomethine)copolymer films obtained in Experiments 1c and 1e showed a low toughness and were not analyzed for the film properties.

TABLE 1

| Experiment No. | Composition [X] | Polymerization solvent | Monomer concentration (wt %) | Polymerization time (h) | Specific viscosity [·] (dL/g) |
|---|---|---|---|---|---|
| 1a | 0.6 | NMP | 37.3 | 24 | 0.166 |
| 1b | 0.7 | NMP | 36.9 | 24 | 0.143 |
| 1c | 0.8 | NMP | 36.5 | 24 | 0.115 |
| 1d | 0.8 | m-cresol | 24.5 | 24 | 0.167 |
| 1e | 0.9 | m-cresol | 25.7 | 24 | 0.160 |

TABLE 2

| Experiment No. | Composition [X] | Tg (° C.) | CTE (ppm/K) | $\Delta n$ | $\epsilon$ | $Td^5$ (N2) (° C.) | $Td^5$ (air) (° C.) |
|---|---|---|---|---|---|---|---|
| 1a | 0.6 | 336 | 7.9 | 0.107 | 2.94 | 485 | 461 |
| 1b | 0.7 | 355 | 15.6 | 0.111 | 2.95 | 481 | 455 |
| 1c | 0.8 | — | — | — | — | — | — |
| 1d | 0.8 | — | 25.5 | 0.122 | 2.91 | 468 | 445 |
| 1e | 0.9 | — | — | — | — | — | — |

Example 2

Experiments 2a and 2b

In these experiments, 1,2,3,4-cyclobutanetetracarboxylic dianhydride, rather than pyromellitic dianhydride, was used as the tetracarboxylic dianhydride to make poly(amic acid-azomethine)copolymers. The polymerization solvent used was N,N-dimethylacetoamide (DMAC). The monomers were used at concentrations shown in FIG. 3. Other than that, the same procedures were followed as in Example 1 and the films were analyzed for physical properties. Other polymerization conditions and the specific viscosity of each copolymer are shown in Table 3 (Polymerization condition and specific viscosity of poly(amic acid-azomethine)copolymers). The film properties are shown in Table 4 (Physical properties of poly(imide-azomethine)copolymer films).

As can be seen from Table 4, each of the poly(imide-azomethine) copolymer films obtained in Experiments 2a and 2b had the required properties: each exhibited a relatively low linear thermal expansion coefficient and a relatively high glass transition temperature.

TABLE 3

| Experiment No. | Composition [X] | Polymerization solvent | Monomer concentration (wt %) | Polymerization time (h) | Specific viscosity [η] (dL/g) |
|---|---|---|---|---|---|
| 2a | 0.5 | DMAc | 40.0 | 24 | 0.152 |
| 2b | 0.2 | DMAc | 31.7 | 24 | 0.314 |

TABLE 4

| Experiment No. | Composition [X] | Tg (° C.) | CTE (ppm/K) | $\Delta n$ | $\epsilon$ | $Td^5$ (N2) (° C.) | $Td^5$ (air) (° C.) |
|---|---|---|---|---|---|---|---|
| 2a | 0.5 | 348 | 32.7 | 0.064 | 2.83 | 431 | 422 |
| 2b | 0.2 | 343 | 28.1 | 0.042 | 2.77 | 431 | 427 |

Example 3

Experiment 3

In this experiment, trans-1,4-cyclohexanediamine, rather than 2,2'-bis(trifluoromethyl)benzidine, was used as the diamine and 3,3',4,4'-biphenyltetracarboxylic dianhydride, rather than pyromellitic dianhydride, was used as the tetracarboxylic dianhydride. Other than that, the same procedures were followed as in Example 1 to make a poly(amic acid-azomethine)copolymer. Trans-1,4-cyclohexanediamine (5 mmol) was first dissolved in N,N-dimethylacetamide. To this solution, 3,3',4,4'-biphenyltetracarboxylic dianhydride powder (4.5 mmol) was slowly added and the mixture was heated at 120° C. for 5 min in an oil bath. Stirring the mixture at room temperature for several hours gave a uniform viscous polyamic acid solution. To this solution, terephthalaldehyde powder (0.5 mmol) was added (total monomer concentration=15 wt %) and the mixture was stirred at room temperature for 24 hours to obtain a poly(amic acid-azomethine) copolymer. The copolymer had a specific viscosity of 0.576 dL/g.

The poly(amic acid-azomethine)copolymer was cast into a film. The film had a high transmittance (70%) to i-ray (365 nm) emitted from a high-pressure mercury lamp. A poly (imide-azomethine)copolymer film was then prepared in the same manner as in Example 1 and was analyzed for physical properties. The film properties are shown in Table 5 (Physical properties of poly(imide-azomethine) opolymer film). As can be seen from Table 5, the poly(imide-azomethine)copolymer film of Example 3 (Experiment 3) had the required properties: it exhibited a relatively low linear thermal expansion coefficient and a relatively high glass transition temperature.

TABLE 5

| Experiment No. | Composition [X] | Tg (° C.) | CTE (ppm/K) | $\Delta n$ | $\epsilon$ | $Td^5$ (N2) (° C.) | $Td^5$ (air) (° C.) |
|---|---|---|---|---|---|---|---|
| 3 | 0.1 | 300 | 17.8 | 0.143 | 3.10 | 466 | 432 |

Example 4

2,3,4-tris(1-oxo-2-diazonaphthoquinone-5-sulfoxy)benzophenone to serve as a diazonaphthoquinone photosensitizer was dissolved in the N,N-dimethylacetamide solution of the poly(amic acid-azomethine)copolymer described in Example 3. The amount of the diazonaphthoquinone photosensitizer was 30 wt % relative to the net weight of the poly(amic acid-azomethine)copolymer. This solution was applied to a silicon wafer that had been surface-treated with a silane-coupling agent. The wafer was then dried at 60° C. for 2 hours in a hot air drier to form a 4 to 5 μm-thick photosensitive film. The wafer was then pre-baked at 80° C. for 10 min and was exposed through a photomask to an i-ray emitted from a reflected high-pressure mercury lamp and filtered through an interference filter. The irradiation was continued for 5 min at an intensity of approximately 3 mW/cm². The exposed film was then developed in a 0.1 wt % aqueous solution of tetramethylammonium hydroxide at 25° C. for 1 to 6 min. The developed film was rinsed with water and was dried at 60° C. for several minutes. The film was heated stepwise at 250° C. for 1 hour and then at 330° C. for additional 1 hour in vacuo to carry out thermal imidization. This resulted in a sharp pattern with a line width of 20 μm.

Comparative Example 1

2,2'-bis(trifluoromethyl)benzidine (4.5 mmol) and 2,2-bis(4-(4-aminophenoxy)phenyl)hexafluoropropane (0.5 mmol) were dissolved in a thoroughly dehydrated N-methyl-2-pyrrolidone in a dry, sealed reaction vessel equipped with a stirrer. To this solution, a terephthalaldehyde powder (5 mmol) was added and the mixture was stirred at room temperature for 24 hours to form a uniform viscous polyazomethine copolymer. The specific viscosity of the polyazomethine copolymer measured in N-methyl-2-pyrrolidone at 30° C. was 0.481 dL/g. The polyazomethine copolymer solution was applied to a glass substrate and was dried at 60° C. for 2 hours. The film formed on the substrate was further heated at 250° C. for 1 hour under reduced pressure to form a 10 to 20 μm-thick strong transparent film of polyazomethine copolymer. Although the film had a glass transition temperature of 269° C. and a relatively high heat resistance (as measured in 5% weight loss temperature in nitrogen) of 445° C., the linear thermal expansion coefficient was too high (97 ppm/K) to achieve the desired low thermal expansion property. This is because evaporating the solvent during the film casting process alone is not enough to promote the in-plane orientation of the polymer chains.

Comparative Example 2

2,2-bis(4-(4-aminophenoxy)phenyl)hexafluoropropane and pyromellitic dianhydride were polymerized to form a polyimide precursor. The precursor had a specific viscosity of 0.696 dL/g. The polyimide precursor solution was applied to a glass substrate and was dried at 60° C. for 2 hours. The precursor film formed on the substrate was imidized at 250° C. for 1 hour under reduced pressure to form a 10 to 20 μm-thick strong transparent film of polyimide. Although the film had a glass transition temperature of 278° C. and a relatively high heat resistance (as measured in 5% weight loss temperature in nitrogen) of 534° C., the linear thermal expansion coefficient was too high (61 ppm/K) to achieve the desired low thermal expansion property. The low birefringence of the polyimide (0.0093) suggests that the high linear thermal expansion coefficient of the polyimide results from poor in-plane orientation of the polyimide chains. This is considered to be because the linearity and the rigidity of the polymer chains required for the imidization-induced in-plane orientation of the polymer molecules were not achieved due to the bent diamine used.

Comparative Example 3

According to the method described in Example 3, trans-1,4-cyclohexanediamine and 3,3',4,4'-biphenyltetracarboxylic dianhydride were polymerized to form a polyimide precursor. The precursor had a specific viscosity of 1.50 dL/g. A photosensitive resin composition using the polyimide precursor was formed into a film in accordance with the method of Example 4. The film was then exposed and developed in an alkaline solution. However, the resulting patterns were not formed. This is because the polyimide precursor used had an excessively high solubility in the alkali solution.

INDUSTRIAL APPLICABILITY

The poly(imide-azomethine)copolymer of the present invention is obtained by imidization of a poly(amic acid-azomethine) copolymer, the polyimide precursor that has amic acid residues introduced in it to serve as the sites for intramolecular cyclization. The poly(imide-azomethine)copolymer of the present invention thus undergoes a reduced thermal expansion. The poly(amic acid-azomethine)copolymer can be combined with a photosensitizer to make a resin composition that has a high photosensitivity so that it can be exposed to light to form a desired pattern. The resin composition is a positive photosensitive resin composition that can be developed in an alkali solution. Such positive photosensitive resin composition can be used to form fine patterns of the poly(imide-azomethine)copolymer that have a low dielectric constant, low thermal expansion coefficient, and high glass transition temperature. Accordingly, the poly(imide-azomethine)copolymer of the present invention is suitable for use in a variety of electronic devices, including protective films of semiconductor devices and interlayer insulating films used in integrated circuits.

The invention claimed is:

1. A positive photosensitive resin composition comprising a poly(amic acid-azomethine)copolymer and a diazonaphthoquinone photosensitizer, wherein the poly(amic acid-azomethine)copolymer comprises azomethine polymer units of the following formula (1) and amic acid polymer units of the following formula (3):

wherein in the formulas (1) and (3), A and D are each independently a divalent aromatic or aliphatic group, and B is a tetravalent aromatic or aliphatic group.

2. The positive photosensitive resin composition according to claim 1, wherein an amount of the diazonaphthoquinone photosensitizer with respect to the poly(amic acid-azomethine)copolymer is 10 to 40% by weight.

3. A method for forming a fine pattern of a poly(imide-azomethine)copolymer, comprising:
  forming the positive photosensitive resin composition according to claim 1 or 2 into a film;
  exposing the film of the positive photosensitive resin composition to a pattern of light;
  developing the exposed film in an alkali solution; and
  subjecting the developed film to a polyimidization process to form a desired fine pattern.

4. The method according to claim 3, wherein the poly(imide-azomethine)copolymer has a linear thermal expansion coefficient of less than 30 ppm/K and a glass transition temperature of 250° C. or above.

* * * * *